United States Patent
Ikeda et al.

(10) Patent No.: US 8,183,597 B2
(45) Date of Patent: May 22, 2012

(54) GAN SEMICONDUCTOR DEVICE HAVING A HIGH WITHSTAND VOLTAGE

(75) Inventors: Nariaki Ikeda, Tokyo (JP); Jiang Li, Tokyo (JP); Seikoh Yoshida, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 227 days.

(21) Appl. No.: 11/568,348

(22) PCT Filed: May 2, 2005

(86) PCT No.: PCT/JP2005/008293
§ 371 (c)(1),
(2), (4) Date: Dec. 22, 2006

(87) PCT Pub. No.: WO2005/106959
PCT Pub. Date: Nov. 10, 2005

(65) Prior Publication Data
US 2007/0210335 A1    Sep. 13, 2007

(30) Foreign Application Priority Data
Apr. 30, 2004  (JP) .................................. 2004-135648

(51) Int. Cl.
*H01L 31/06*    (2006.01)
(52) U.S. Cl. ................. 257/201; 257/472; 257/E29.091; 257/E29.149; 257/E29.253
(58) Field of Classification Search .................. 257/201, 257/472, E29.091, E29.149, E29.253
See application file for complete search history.

(56) References Cited

U.S. PATENT DOCUMENTS

| | | | | |
|---|---|---|---|---|
| 6,221,684 B1 * | 4/2001 | Sugawara et al. | ............... | 438/47 |
| 6,768,146 B2 * | 7/2004 | Yoshida | ......................... | 257/279 |
| 6,768,149 B1 * | 7/2004 | Mann et al. | .................... | 257/292 |

(Continued)

FOREIGN PATENT DOCUMENTS

JP    2003229566 A    8/2003

(Continued)

OTHER PUBLICATIONS

Dong-Hyun Cho et al., AlN/AlGaN/GaN Metal Insulator Semiconductor Heterostructure Field Effect Transistor Jul. 2002, Jpn. J. Appl. Phys. vol. 41 (2002) pp. 4481-4483, Part 1, No. 7A, (© 2002 The Japan Society of Applied Physics).*

*Primary Examiner* — Evan Pert
*Assistant Examiner* — Hajar Kolahdouzan
(74) *Attorney, Agent, or Firm* — Lowe, Hauptman, Ham & Berner, LLP

(57) ABSTRACT

A GaN semiconductor device which has a low on-resistance, has a very small leak current when a reverse bias voltage is applied and is very excellent in withstand voltage characteristic, said GaN semiconductor device having a structure being provided with a III-V nitride semiconductor layer containing at least one hetero junction structure of III-V nitride semiconductors having different band gap energies; a first anode electrode arranged on a surface of said III-V nitride semiconductor by Schottky junction; a second anode electrode which is arranged on the surface of said III-V nitride semiconductor layer by Schottky junction, is electrically connected with said first anode electrode and forms a higher Schottky barrier than a Schottky barrier formed by said first anode electrode; and an insulating protection film which is brought into contact with said second anode electrode and is arranged on the surface of said III-V nitride semiconductor layer.

18 Claims, 4 Drawing Sheets

U.S. PATENT DOCUMENTS

| | | | |
|---|---|---|---|
| 7,170,111 B2 * | 1/2007 | Saxler | 257/194 |
| 2002/0024057 A1 * | 2/2002 | Inokuchi et al. | 257/155 |
| 2003/0098462 A1 | 5/2003 | Yoshida | |
| 2003/0102482 A1 * | 6/2003 | Saxler | 257/85 |
| 2003/0121468 A1 * | 7/2003 | Boone et al. | 117/78 |

FOREIGN PATENT DOCUMENTS

| | | |
|---|---|---|
| JP | 200431896 A | 1/2004 |
| WO | 03026021 A2 | 3/2003 |

* cited by examiner

GAN SEMICONDUCTOR DEVICE HAVING A HIGH WITHSTAND VOLTAGE

TECHNICAL FIELD

The present invention relates to a GaN semiconductor device, and more particularly relates to a GaN semiconductor device which is high in withstand voltage, has a low on-resistance, and has a small leak current when a reverse bias voltage is applied.

RELATED ART

An electronic device formed out of a semiconductor device is publicly known, and for example, a switching element for a power converting device, composed of a high-withstand voltage bipolar transistor is known. Such a high-power switching element is required to have a low on-resistance in addition to a high withstand voltage. Due to this, in recent years a power MOSFET (metal oxide semiconductor FET) having a low on-resistance or an IGBT (insulated gate bipolar transistor) having a bipolar transistor and a MOSFET combined together is used as a switching element in place of a bipolar transistor (Japanese Patent Laid-Open Publication No. Hei 10-242,165 for example).

Further, in recent years an electronic device made of a nitride-based compound semiconductor represented by GaN is regarded to be promising as a device being capable of performing a high-temperature operation, having a high withstand voltage and being capable of performing a high-speed operation, and the development of it has been advanced. Particularly, the application of it as an electronic device having a high withstand voltage and being capable of performing a large-current operation is studied.

For example, Japanese Patent Laid-Open Publication No. 2004-31,896 has proposed a Schottky diode using a GaN semiconductor having a high withstand voltage and a low on-resistance.

DISCLOSURE OF THE INVENTION

The object of the invention is to provide a GaN semiconductor device which has a low on-resistance and a small leak current when a reverse bias voltage is applied, suppresses the occurrence of concentration of an electric field between an anode electrode and a cathode electrode and causes no atmospheric discharge when a high voltage is applied, and thereby shows an excellent withstand voltage characteristic.

In order to achieve the above-described object, in the present invention there is provided a GaN semiconductor device comprising;

a III-V nitride semiconductor layer;

a first anode electrode arranged on a surface of said III-V nitride semiconductor layer by Schottky junction;

a second anode electrode which is arranged on the surface of said III-V nitride semiconductor layer by Schottky junction, is electrically connected with said first anode electrode and forms a higher Schottky barrier than a Schottky barrier formed by said first anode electrode; and an insulating protection film which is brought into contact with said second anode electrode and is arranged on the surface of said III-V nitride semiconductor layer.

In this GaN semiconductor device, said III-V nitride semiconductor layer preferably contains at least one hetero junction structure formed out of III-V nitride semiconductors being different in band gap energy, and said hetero junction structure is preferably formed out of a lower layer composed of a first III-V nitride semiconductor and an upper layer composed of a second III-V nitride semiconductor having a larger band gap energy than that of said first III-V nitride semiconductor.

And in this GaN semiconductor device, it is preferable that said first anode electrode is more narrow in width than said second anode electrode and a composite anode electrode formed by covering said first anode electrode with said second anode electrode is formed.

And a cathode electrode is arranged on the surface of said III-V nitride semiconductor layer, being isolated in plane from said second anode electrode, and at least the surface of said III-V nitride semiconductor layer situated between said second anode electrode and said cathode electrode is preferably covered with said insulating protection film.

In this case, it is preferable that one or both of an end portion of said second anode electrode and an end portion of said cathode electrode, and an end of said insulating protection film are stacked on one another, and it is particularly preferable that an end portion of said second anode electrode and/or an end portion of said cathode electrode is stacked on an end portion of said insulating protection film.

Further, in this GaN semiconductor device, it is preferable that the thickness of a spot of said III-V nitride semiconductor layer where said first anode electrode and said second anode electrode are arranged is thinner than the thickness of a spot where they are not arranged, and in this case the thickness of said upper layer out of said upper layer and said lower layer forming said hetero junction structure is made thinner.

And it is preferable that a III-V nitride semiconductor layer having a smaller band gap energy than a band gap energy shown by an upper layer is interposed between said first anode electrode and said upper layer of said second III-V nitride semiconductor.

And it is preferable that an intermediate layer composed of a III-V nitride semiconductor having a larger band gap energy than a band gap energy of the III-V nitride semiconductor of the upper layer is interposed between said upper layer and said lower layer forming said hetero junction structure.

And it is preferable that said III-V nitride semiconductor layer on which said cathode electrode is arranged is in contact with at least said lower layer forming said hetero junction structure.

And it is preferable that a semiconductor material for said upper layer forming said hetero junction structure has a composition indicated by the following formula:

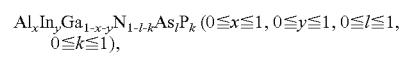

and a semiconductor material forming said lower layer forming said hetero junction structure has a composition indicated by the following formula:

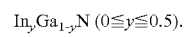

EXPLANATIONS OF LETTERS OR NUMERALS $C_1$, $C_2$, $C_3$, $C_4$, $C_5$, $C_6$: GaN semiconductor device, 10, 11: Substrate, 12: Buffer layer, 13: III-V nitride semiconductor layer, 13A: Lower layer, 13B: Upper layer, 13C: Interface, 14: Contact layer, 14a: Side face, 15: Cathode electrode, 15a: End portion, 16: Two-dimensional electron gas, 17: Composite anode electrode, 17A: First anode electrode, 17B: Second anode electrode, 17b: End portion, 18: Insulating protection film, 19: Layer, 20: Intermediate layer

BEST MODE FOR CARRYING OUT THE INVENTION

Figure 1:
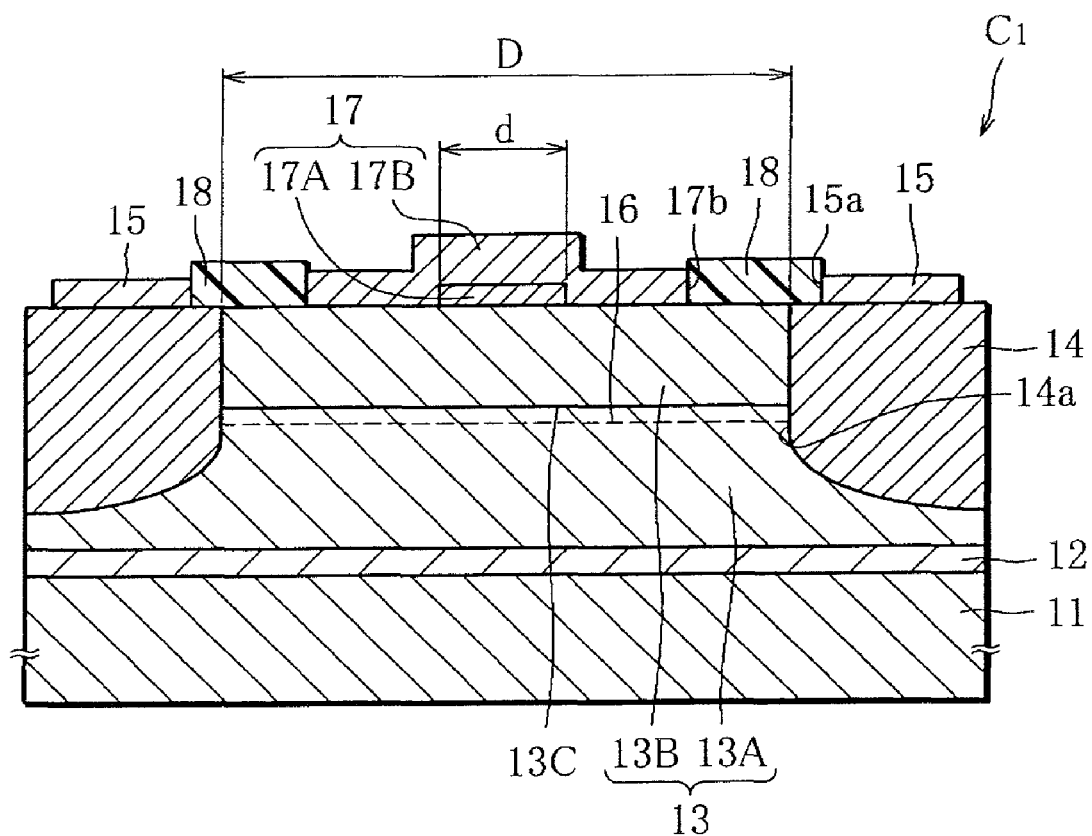
FIG. 1 is a sectional view showing a GaN semiconductor device $C_1$ of the present invention.

An example $C_1$ of the present invention device is shown in FIG. 1 as a first embodiment.

The device $C_1$ is a diode having a structure in which a buffer layer 12 of a specified thickness and a III-V nitride semiconductor layer 13 described later are stacked in order on an insulating or semi-insulating substrate 11 such as a sapphire substrate.

As a semiconductor material for the buffer layer 12, GaN, AlN, AlGaN or the like is ordinarily used and may be used as a multilayer structure of them, a superlattice structure of AlN/GaN or the like.

And a contact layer 14 described later is formed on each side of the III-V nitride semiconductor layer 13 so as to be flush with the said semiconductor layer 13 and a cathode electrode 15 is arranged on the surface of the contact layer 14.

Hereupon, the semiconductor layer 13 has a hetero junction structure formed by stacking on each other a lower layer 13A formed out of a first III-V nitride semiconductor having a certain band gap energy and an upper layer 13B formed out of a second III-V nitride semiconductor having a larger band gap energy than the band gap energy of a semiconductor material forming the lower layer 13A.

Therefore, an interface 13C between the lower layer 13A and the upper layer 13B makes a hetero junction interface, and a two-dimensional electron gas 16 is generated in layers by a piezoelectric effect in a surface layer of the lower layer 13A located directly under this interface 13C.

As a combination (represented by B/A) of a first III-V nitride semiconductor (referred to as A) to form the lower layer 13A and a second III-V nitride semiconductor (referred to as B) to form the upper layer 13B, there can be mentioned, for example, AlGaN/GaN, AlInGaN/GaN, AlInGaN/InGaN, AlGaN/InGaN and the like. And in case of interposing an intermediate layer having a larger band gap energy than the upper layer 13B between the upper layer 13B and the lower layer 13A, a configuration of AlGaN/AlN/GaN or the like can be mentioned as upper layer/intermediate layer/lower layer.

A first anode electrode 17A having a more narrow width d than a specified width D is arranged by Schottky junction with the upper layer 13B nearly in the middle of the surface of the above-described upper layer 13B formed having the width D.

Ordinarily, D is set to be 6 to 200 µm and d is set at 2 to 200 µm within a range in which d does not exceed D.

A second anode electrode 17B being wider than the first anode electrode 17A is formed in a state of covering this first anode electrode 17A. Therefore, the first anode electrode 17A and the second anode electrode 17B, which are electrically connected to each other, form a composite anode electrode 17 as a whole.

And a foot of the second anode electrode 17B is also joined with the upper layer 13B by Schottky junction in a similar manner to the case of the first anode electrode 17A. In this case, the height of a Schottky barrier formed by the second anode electrode 17B and the upper layer 13B is made higher than the height of a Schottky barrier formed by the first anode electrode 17A and the upper layer 13B. The width of a portion in which the second anode electrode 17B is joined with the upper layer 13B is 2 to 10 µm.

For example, in case that the upper layer 13B is formed out of n-type GaN, Ti, W, Ag, Al, Ta or the like for example is used as a material for the first anode electrode 17A.

As a material for the second anode electrode 17B, there can be mentioned for example Pt, Ni, Pd, Au, Cu and the like.

And it is preferable to set the thickness of the first anode electrode 17A at about 0.02 to 0.5 µm and the thickness of the second anode electrode 17B at about 0.02 to 0.5 µm.

The surface of the upper layer 13B appearing between an end portion 17b of the second anode electrode 17B and an end portion 15a of the cathode electrode 15 is covered with an insulating protection film 18 in a state of being in contact with the end portion 17b and the end portion 15a.

It is preferred to use a material having a high permittivity as a material to form this insulating protection film 18. It is possible to mention $SiN_x$, $SiO_2$, $Al_2O_3$, $Ta_2O_3$, $SiO_{1-x}N_x$ and the like, for example.

This insulating protection film 18 is arranged in order to prevent the device from being damaged by suppressing the occurrence of atmospheric discharge between the composite anode electrode 17 and the cathode electrode 15 when a high voltage is applied between both the electrodes. And at the same time, it is arranged in order to enhance the withstand voltage characteristic of the whole device by alleviating the occurrence of concentration of electric field in the end portions of both the electrodes.

As an aspect of arrangement, as shown in FIG. 1, the insulating protection film 18 is arranged so that end portions of the insulating protection film 18 are in contact with both of the end portion 17b of the second anode electrode 17B and the end portion 15a of the cathode electrode 15. Concretely, it is arranged so as to be in contact with the end faces of the end portions 17b and 15a.

Figure 2:
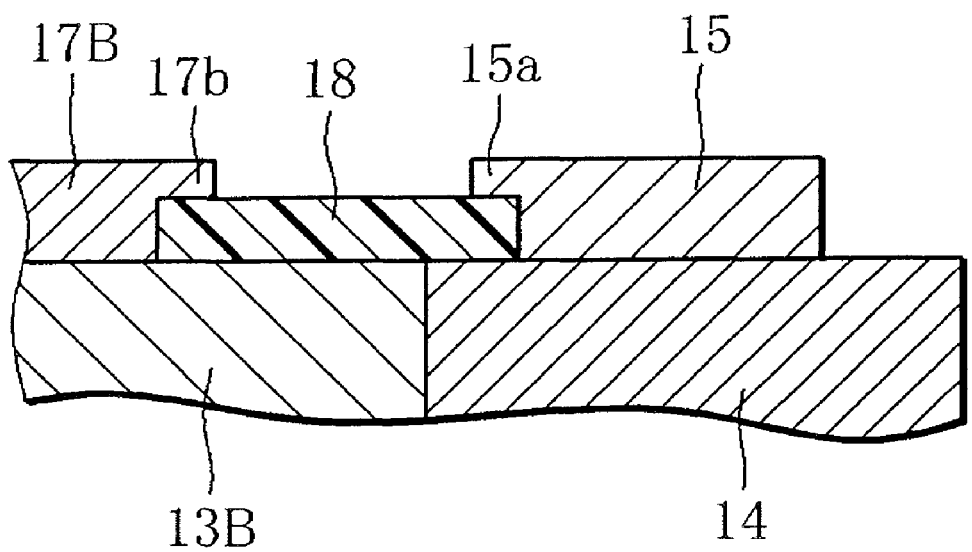
FIG. 2 is a partial sectional view showing a state of arrangement in which a second anode electrode, an insulating protection film and a cathode electrode of a GaN semiconductor device are arranged relative to one another.

And as shown in FIG. 2, the insulting protecting film 18 may be arranged so that both end portions of the insulating protection film 18 are covered respectively with the end portion 17b of the second anode electrode 17B and the end portion 15a of the cathode electrode 15 and are respectively stacked on them.

In this case, since the contact area between the end portion 17b of the second anode electrode 17B and the end portion of the insulating protection film 18 and the contact area of the end portion 15a of the cathode electrode 15 and the end portion of the insulating protection film 18 are made larger in comparison with the case of a simple contact state between both end faces, the occurrence of concentration of electric field between the end portions of both electrodes is greatly alleviated and the withstand voltage of the device $C_1$ is made higher and thereby atmospheric discharge is made more difficult to occur.

In this device $C_1$, an electric current path formed when a forward bias voltage is applied to the composite anode electrode 17 is a path of the composite anode electrode 17→the upper layer 13B→a two-dimensional electron gas 16 generated in the surface layer of the lower layer 13A→the cathode electrode 15.

Since the two-dimensional electron gas 16 is a layer provided with a high electron mobility, its electric resistance is very small. Therefore, since this device $C_1$ contains the two-dimensional electron gas having such a characteristic in its electric current path, it is greatly lower in on-resistance in comparison with a device containing no two-dimensional electron gas.

And in case of the device $C_1$, since a contact layer 14 is interposed between the III-V nitride semiconductor layer 13 and the cathode electrode 15 which are situated in the electric current path, it is possible to more effectively reduce the on-resistance.

Concretely, this device $C_1$ has a structure in which both sides of the semiconductor layer 13 are etched away, a contact layer 14 composed of a semiconductor material such as GaN, InGaN or the like having an n-type impurity doped in it is formed on each of the etched portions, and the cathode electrode 15 is directly ohmic-joined and arranged on the surface of this contact layer 14.

In this case it is preferable that the contact layer 14 is formed so as to have a thickness allowing its inner side face 14a to come into contact with an end portion of the two-dimensional electron gas 16 generated in the surface layer of the lower layer 13A, namely, a thickness including the hetero junction interface 13C.

And as disclosed in Japanese Patent Laid-Open Publication No. 2002-184,972, it is also preferable to make more the amount of etching in the horizontal direction of the lower layer 13A situated under the hetero junction interface 13C in comparison with the upper layer 13B when etching away both sides of the semiconductor layer 13 and thereby form undercut portions at both the side portions, and form the contact layers 14 so as to be in contact with the under-cut portions. The reason is that an electric connection between the two-dimensional electron gas 16 generated in the lower layer 13A and the contact layer 14 is made more secure.

In this device $C_1$, when a forward bias voltage is applied to the composite anode electrode 17, the first anode electrode 17A having a relatively lower Schottky barrier operates at once and thereafter the second anode electrode 17B operates in the process in which the applied voltage is rising.

Therefore, since the rising-up of electric current in the forward direction is made faster, it is possible to make the on-resistance lower and the on-voltage closer to zero.

On the other hand, when a reverse bias voltage is applied, a depletion layer expands in the upper layer 13B situated directly under the foot of the second anode electrode 17B, an electric current path is pinched off and thereby the electric current is shut off.

Figure 3:
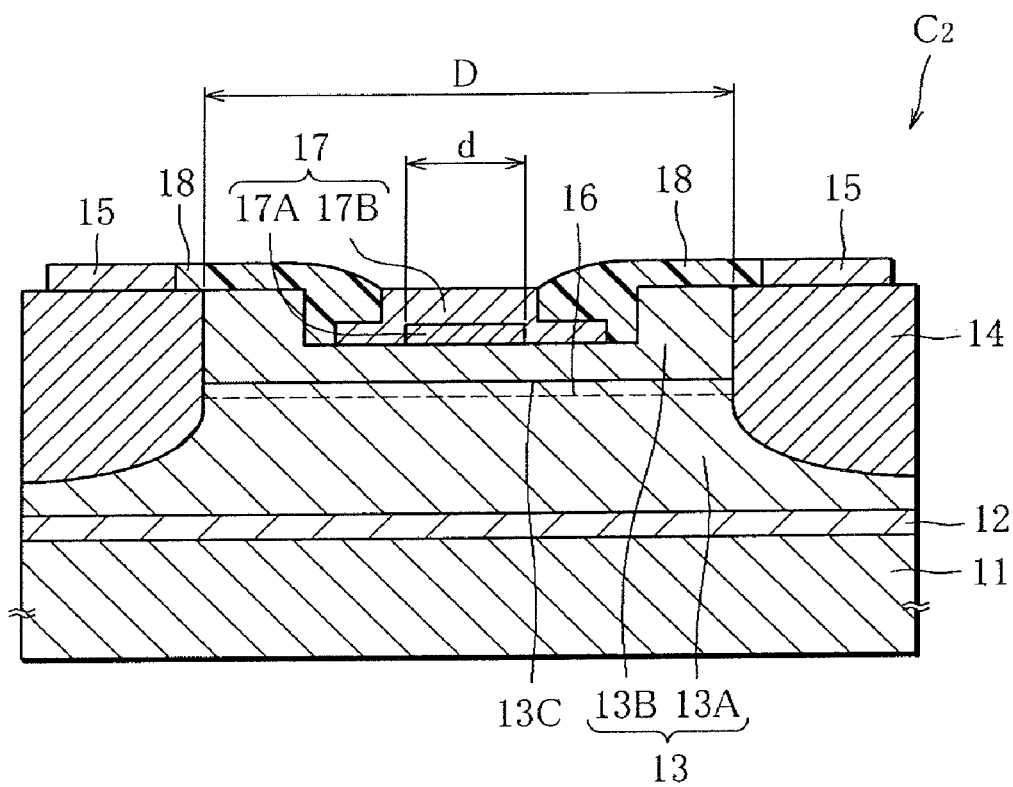
FIG. 3 is a sectional view showing a GaN semiconductor device $C_2$ of the present invention.

And even when the applied voltage becomes a high voltage, since the insulating protection film 18 covering the surface of the upper layer 13B is arranged between the end portion 17b of the second anode electrode 17B and the end portion 15a of the cathode electrode 15, the concentration of electric field in the end portions of the electrodes is alleviated and atmospheric discharge is made difficult to occur and thereby the high withstand voltage characteristic of the device is enhanced A second embodiment of the present invention device is shown in FIG. 3.

This device $C_2$ has a similar structure to the device $C_1$ except that in the device $C_1$ the thickness of the upper layer 13B of a spot where the composite anode electrode 17 is arranged is made thinner than the thickness of another spot where the composite anode electrode 17 is not arranged.

In case of this device $C_2$, since the thickness of the upper layer 13B directly under the composite anode electrode 17 is made thinner, when a reverse bias voltage is applied, even if a low voltage is applied, a depletion layer expanding directly under a foot of the second anode electrode 17B can cross the hetero junction interface 13C and expand to the lower layer 13A. Due to this, the two-dimensional electron gas 16 generated in the surface layer of the lower layer 13A is vanished by the depletion layer.

In case of this device $C_2$, therefore, even if the two-dimensional electron gas 16 is contained in a part of the electric current path leading from the composite anode electrode 17 to the cathode electrode 15, the electric current path can be securely shut off when a reverse bias voltage is applied.

That is to say, this device $C_2$ can suppress the occurrence of a leak current when a reverse bias voltage is applied.

And it is provided with a high withstand voltage characteristic since the insulating protection film 18 is arranged between the second anode electrode 17B and the cathode electrode 15.

The above-described effect can be attained not only by making thinner the thickness of the upper layer 13B in a spot where the composite anode electrode 17 is arranged as in the case of the device $C_2$ but also by for example making thin the thickness of the whole upper layer 13B. To make the whole upper layer thin is rather more preferable in that the operation of making thinner a part of the upper layer can be omitted.

Figure 4:
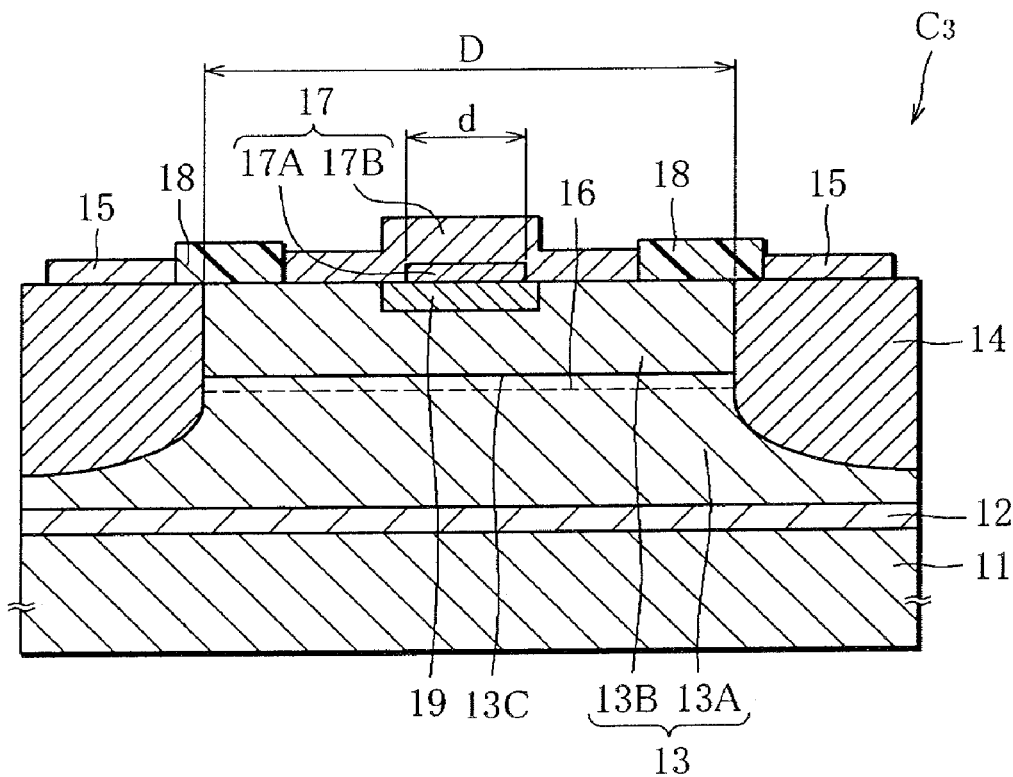
FIG. 4 is a sectional view showing a GaN semiconductor device $C_3$ of the present invention.

A third embodiment $C_3$ of the present invention device is shown in FIG. 4.

This device $C_3$ has a similar structure to the device $C_1$ except that a layer 19 formed out of a III-V nitride semiconductor having a smaller band gap energy than the band gap energy of a III-V nitride semiconductor forming the upper layer 13B is formed in the upper layer 13B, being in contact with the first anode electrode 17A in the device $C_1$.

In case of this device $C_3$, the height of a Schottky barrier formed by the second anode electrode 17B and the layer 19 is made lower than the height of a Schottky barrier formed by the first anode electrode 17A and the upper layer 13B.

And the height of the Schottky barrier formed by the first anode electrode 17A and the layer 19 can be made furthermore lower by using a material having a smaller band gap energy as a III-V nitride semiconductor used in forming this layer 19.

As a result, when a forward bias voltage is applied to the composite anode electrode 17, the first anode electrode 17A quickly operates and the on-voltage can be made furthermore lower in comparison with the device $C_1$. And this device is provided with a high withstand voltage characteristic due to action of the insulating protection film 18.

Figure 5:
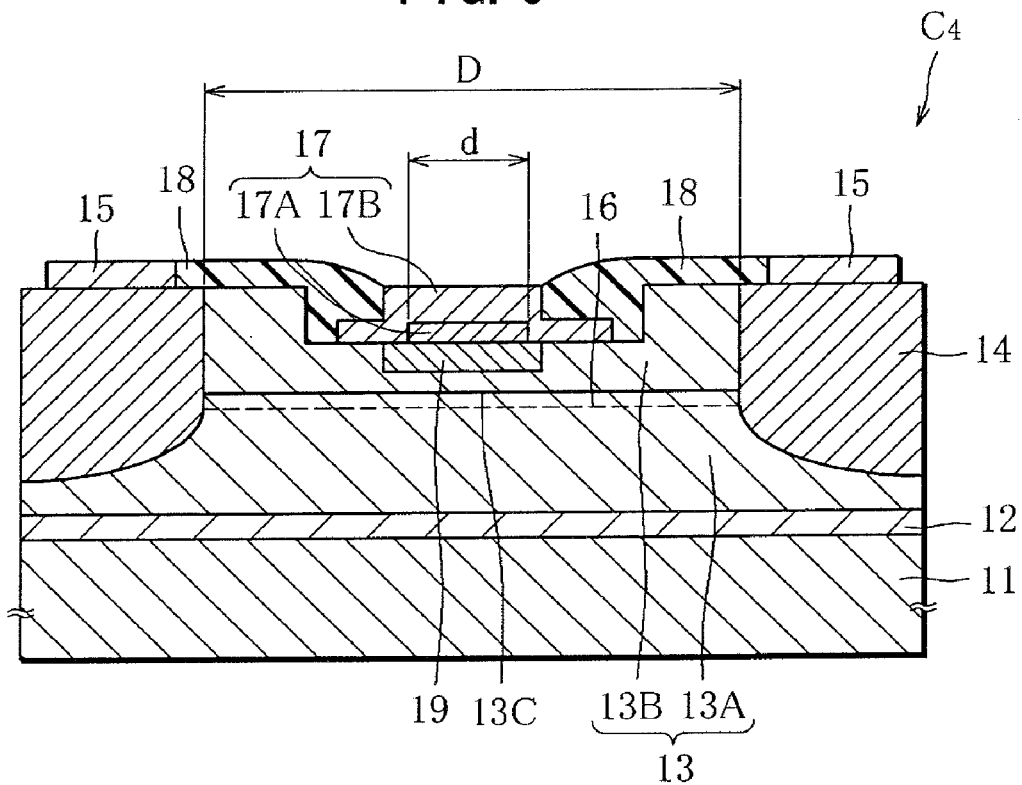
FIG. 5 is a sectional view showing a GaN semiconductor device $C_4$ of the present invention.

FIG. 5 shows a device $C_4$ of a structure where the above-described layer 19 is formed on the upper layer 13B in the device $C_2$.

This device $C_4$ is provided with a characteristic of the device $C_2$ already described, namely, a characteristic suppressing the occurrence of a leak current when a reverse bias voltage is applied as well as provided with a characteristic of the device $C_3$ already described, namely, a characteristic of further lowering the on-voltage when a forward bias voltage is applied, that is, a high withstand voltage characteristic.

Figure 6:
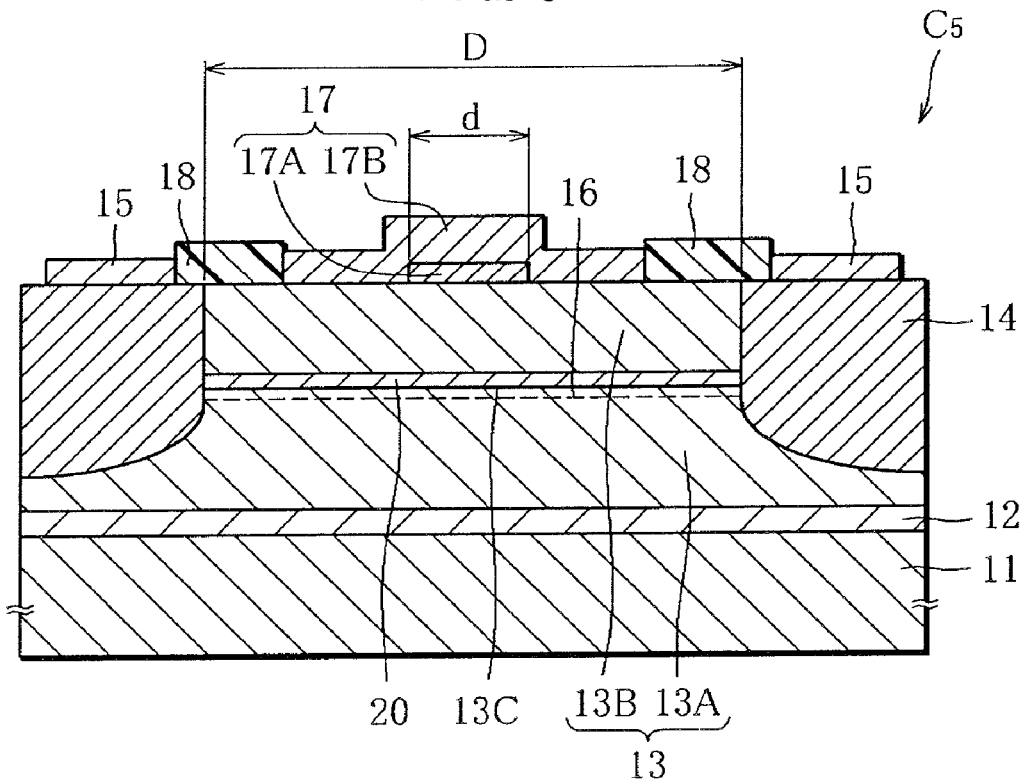
FIG. 6 is a sectional view showing a GaN semiconductor device $C_5$ of the present invention.

A fourth embodiment $C_5$ of the present invention device is shown in FIG. 6.

This device $C_5$ has a similar structure to the device $C_1$ except that an intermediate layer 20 formed out of a III-V nitride semiconductor having a larger band gap energy than the band gap energy of the III-V nitride semiconductor forming the upper layer 13B is interposed between the upper layer 13B and the lower layer 13A.

In case of this device $C_5$, the difference in band gap energy between the lower layer 13A and the intermediate layer 20 is larger than the case of the device $C_1$.

Due to this, a piezoelectric effect is more efficiently exhibited in the interface between this intermediate layer 20 and the lower layer 13A in comparison with the device $C_1$, and the two-dimensional electron gas 16 generated in the surface layer of the lower layer 13A is made higher in density.

Therefore, the on-resistance when a forward bias voltage is applied to the composite anode electrode 17 is made furthermore lower.

Figure 7:
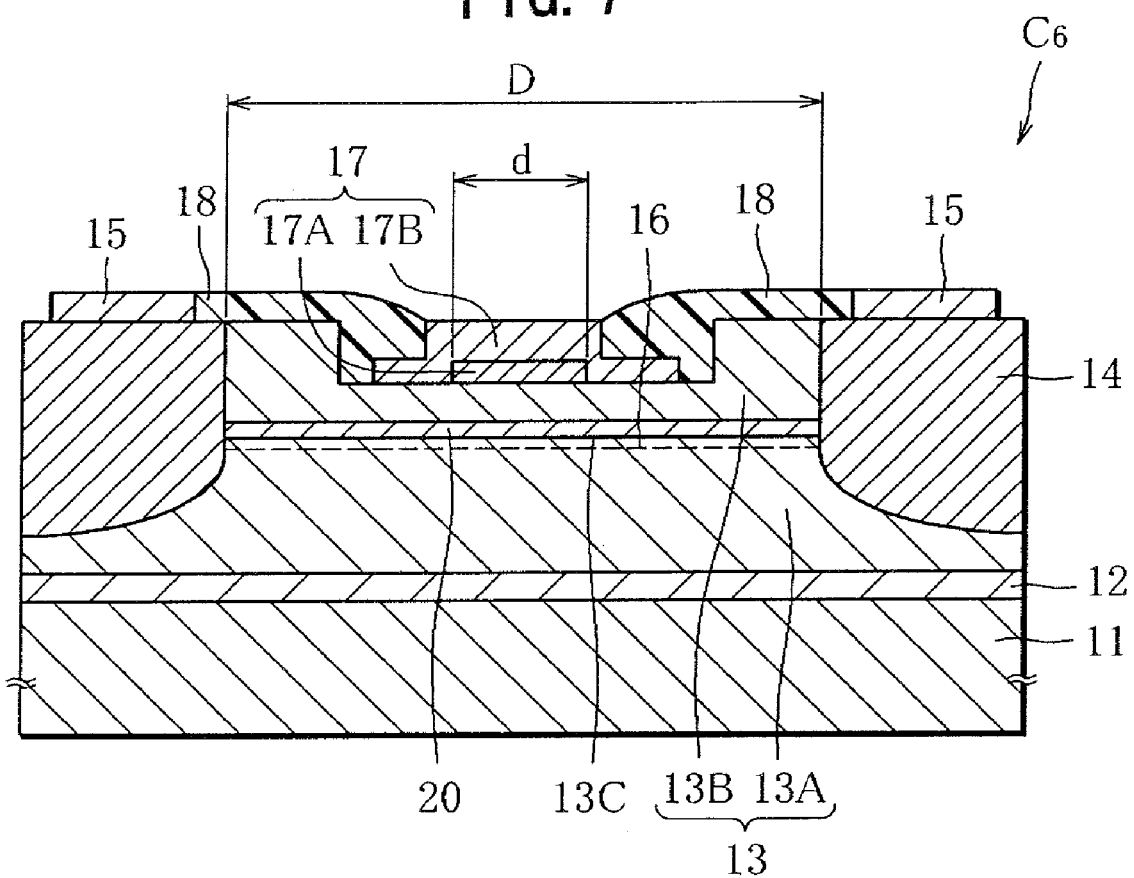
FIG. 7 is a sectional view showing a GaN semiconductor device $C_6$ of the present invention.

FIG. 7 shows a device $C_6$ of a structure where the above-described intermediate layer 20 is interposed into the III-V nitride semiconductor layer 13 in the device $C_2$.

This device $C_6$ is provided with a characteristic making the on-resistance furthermore lower when a forward bias voltage is applied in addition to a characteristic of the device $C_2$.

In the above-described devices, a material indicated, for example, by the following formula:
$Al_xIn_yGa_{1-x-y}N_{1-l-k}As_lP_k$ (where $0 \leq x \leq 1$, $0 \leq y \leq 1$, $0 \leq l \leq 1$, $0 \leq k \leq 1$) is preferable as a semiconductor material for forming a III-V nitride semiconductor layer.

This material has properties which a nitride-based compound semiconductor is inherently provided with and is preferable as a material for a GaN semiconductor device aiming at a high-temperature operation, a high withstand voltage and a high-speed operation.

Particularly, $In_yGa_{1-y}N$ (the case of x=0, l=0 and k=0 in the above formula) having n-type impurities densely doped in it is preferable as a material for a contact layer 15 and a layer 19 of the device $C_3$ or the device $C_4$.

In case of using this $In_yGa_{1-y}N$ having n-type impurities doped in it as a material for the contact layer 14, since this $In_yGa_{1-y}N$ is small in band gap energy, the resistance is lowered when a cathode electrode 15 is ohmic-joined to this. And further when the density of n-type impurities doped is made higher, the above-described resistance can be further lowered.

And since the height of a Schottky barrier formed between an upper layer 13B and a first anode electrode 17A can be made further lower by forming the upper layer 13B out of the above-described $In_yGa_{1-y}N$ having n-type impurities doped in it, it is possible to further lower the on-voltage when a forward bias voltage is applied. And since an n-type impurity doped to $5 \times 10^{17}$ cm$^{-3}$ or more makes electric current easy to flow through the device when the first anode electrode 17A operates, this is preferable.

And it is preferable that in a III-V nitride semiconductor layer 13 composed of an upper layer 13B and a lower layer 13A, one or two or more kinds of p-type impurities of Mg, Zn and C are doped into the lower layer 13A.

The reason is that the intrinsic degree of the lower layer 13A is made high, a depletion layer is made easy to expand in the lower layer 13A when a reverse bias voltage is applied to a composite anode electrode 17, a two-dimensional electron gas 16 generated in the surface layer of the lower layer 13A is vanished, and thereby the effect of suppressing the occurrence of a leak current is enhanced.

And in the devices $C_2$, $C_4$ and $C_6$, it is preferable that the thickness of an upper layer 13B in a spot where a composite anode electrode 17 is arranged is set at 10 nm or less. The reason is that when a reverse bias voltage is applied to the composite anode electrode 17, a depletion layer expanding directly under the second anode electrode 17B becomes easy to reach the lower layer 13A and thereby it is possible to efficiently suppress the occurrence of a leak current.

And it is preferable that the thickness of an intermediate layer 20 in the devices $C_3$ and $C_4$ is set at 5 nm or less. The reason is that since the band gap energy of a material to form this intermediate layer 20 is very large and acts as a barrier against electrons, this thickness when it is too thick increases the resistance.

As a constituent material for this intermediate layer 20, AlN can be first mentioned. This material is a material having the largest band gap energy among materials represented by the above-described composition formula.

In case of forming the intermediate layer 20 out of this material, a layer formed out of a material being intermediate in band gap energy between an AlN layer 20 and an upper layer 13B, for example, a layer made of $Al_xGa_{1-x}N$ may be interposed between both the layers 20 and 13B in order to enhance the crystallizability in an interface between the AlN layer 20 and the upper layer 13B. And as a material for the intermediate layer 20, $Al_xGa_{1-x}N$ can be also used so long as it meets the condition that it is larger in band gap energy than the upper layer 13B.

EXAMPLE

Example 1

A GaN semiconductor device $C_1$ shown in FIG. 1 was manufactured in the following manner by using an MOCVD (metal organic chemical deposition) apparatus and by using a sapphire substrate as a substrate 11.

A sapphire substrate 11 was introduced into the MOCVD apparatus, the apparatus was vacuumed by a turbo pump until the degree of vacuum was made $1 \times 10^{-6}$ hPa or less, and thereafter the degree of vacuum was made to be 100 hPa and the sapphire substrate 11 was raised in temperature and heated to a temperature of 1100° C.

At the point of time when the temperature was stabilized, the substrate 11 was rotated at 900 rpm, trimethylgallium (TMG) was introduced at a flow rate of 100 cm$^3$/min and ammonia was introduced at a flow rate of 12 L/min for 4 minutes into the apparatus, and a buffer layer 12 of about 50 nm in thickness composed of GaN was formed on the surface of the substrate 11.

Next, a crystal growth in 1000 sec was performed by introducing TMG at 100 cm$^3$/min, ammonia at 12 L/min and CCl$_4$ at 10 cm$^3$/min into the apparatus, and thereby a lower layer 13A of 2000 nm in thickness composed of GaN was formed on the buffer layer 12.

Here, CCl$_4$ is a material for C being a dopant for enhancing the intrinsic degree of a crystal growth layer (lower layer).

Next, a crystal growth in 60 sec was performed by introducing trimethylaluminum (TMA) at a flow rate of 50 cm$^3$/min, TMG at a flow rate of 100 cm$^3$/min and ammonia at a flow rate of 12 L/min into the apparatus, and thereby an upper layer 13B of 30 nm in thickness composed of i-$Al_{0.2}Ga_{0.8}N$ was formed on the lower layer 13A.

Next, an SiO$_2$ film was formed on the whole surface of the upper layer 13B, the SiO$_2$ film on a spot where a cathode electrode 15 was to be arranged was removed, the upper layer 13B was etched by means of an etching apparatus using a Cl$_2$ gas as a main etchant, and thereby a groove of about 50 nm in depth was carved This depth is lower by about 20 nm than a hetero junction interface 13C between the upper layer and the lower layer and is sufficiently lower than the position of a two-dimensional electron gas 16 generated in the lower layer 13A.

Next, using the MOCVD apparatus, a crystal growth was performed at a growth temperature of 1050° C. for five minutes by using trimethylindium (TMI) at a flow rate of 50 cm$^3$/min, TMG at a flow rate of 100 cm$^3$/min, ammonia at a flow rate of 12 L/min and SiH$_4$ (used as n-type impurity) at a flow rate of 10 cm$^3$/min, and thus a contact layer 14 was formed by filling the formed groove with n-In$_{0.2}$Ga$_{0.8}$N (of 1×10$^{19}$ cm$^{-3}$ in carrier density).

And using an ordinary EB vapor deposition method and lift-off method, on the surface of the upper layer 13B a first anode electrode 17A of 10 μm in width (d) composed of Ti/Al and a second anode electrode 17B of 20 μm in width composed of Pt/Au were formed and thereby a composite anode electrode 17 was arranged.

Next, a cathode electrode 15 having a structure in which Au was stacked on TaSi was arranged on the contact layer 14.

Finally, by means of a plasma CVD method, an insulating protection film 18 having a structure of SiN/SiO$_2$ was arranged by stacking SiN of 0.3 μm in thickness on parts excluding the anode electrode and the cathode electrode and then stacking SiO$_2$ of 0.5 to 1 μm in thickness.

In this device C$_1$, a leak current and a withstand voltage were measured. A leak current of 100 μA, an on-resistance of about 50 mΩ and a withstand voltage of about 300 V were obtained.

Example 2

In the manufacturing process of example 1, after a contact layer 14 was formed, again an SiO$_2$ film was formed on the whole surface of the contact layer 14, a spot of the SiO$_2$ film where a composite anode electrode was to be arranged was removed to open and a groove of 10 μm in width and 20 nm in depth was formed in the upper layer 13B by performing an etching process by means of a dry etching apparatus using a chlorine-based, chloride-based or methane-based etching gas.

Next, a device C$_2$ shown in FIG. 3 was manufactured by arranging a composite anode electrode, a cathode electrode and an insulating protection film in the groove in a similar manner to example 1.

A leak current and a withstand voltage of this device C$_2$ were measured. A leak current of 1 μA or less, an on-resistance of about 50 mΩ and a withstand voltage of about 500 V were obtained.

Example 3

In the manufacturing process of example 1, after a contact layer 14 was formed, again an SiO$_2$ film was formed on the whole surface of the contact layer 14, a spot of the SiO$_2$ where a layer 19 was to be formed, as shown in FIG. 4, was removed to open and a groove of 10 μm in width and 20 nm in depth was formed in the upper layer 13B by performing an etching process by means of a dry etching apparatus using a chlorine-based, chloride-based or methane-based etching gas.

Next, using the MOCVD apparatus again, a crystal growth was performed by using TMA at a flow rate of 25 cm$^3$/min, TMG at a flow rate of 50 cm$^3$/min and ammonia at a flow rate of 12 L/min, and the groove was filled with Al$_{0.1}$Ga$_{0.9}$N.

After this, a device C$_3$ of the structure shown in FIG. 4 was manufactured by forming a composite anode electrode, a cathode electrode and an insulating protection film in a similar manner to example 1.

A leak current of this device C$_3$ was 1 μA or less, an on-resistance was about 40 mΩ and a withstand voltage was about 500 V.

Example 4

In the manufacturing process of example 1, after a lower layer 13A was formed, a crystal growth was performed by changing over a gas source to TMA at a flow rate of 50 cm$^3$/min and ammonia at a flow rate of 12 L/min, and thereby an intermediate layer 20 of 2 nm in thickness composed of AlN was formed.

After this, a device C$_5$ shown in FIG. 6 was manufactured in a similar manner to example 1.

A leak current of this device C$_5$ was 1 μA or less, an on-resistance was about 30 mΩ and a withstand voltage was about 500 V.

INDUSTRIAL APPLICABILITY

Any of these GaN semiconductor devices is as low as about 30 mΩ in on-resistance and may perform a large-current operation of about 100 A.

And its leak current when a reverse bias voltage is applied shows a value of 1 μA or less, said value being lower by a factor of about 3 digits in comparison with a conventional GaN semiconductor device.

And since the concentration of electric field at an end portion of a second anode electrode and an end portion of a cathode electrode is alleviated due to action of an insulating protection film, even if a high voltage is applied, no atmospheric discharge occurs and thus a very excellent withstand voltage characteristic is obtained.

Therefore, this device is useful as an electronic device for power supply such as a DC-DC converter, an inverter and the like.

The invention claimed is:

1. A GaN semiconductor device, wherein comprising:
 a III-V nitride semiconductor layer including
  a first layer of first III-V nitride semiconductor having a first bandgap energy, and
  a second layer of second III-V nitride semiconductor having a second bandgap energy larger than the first bandgap energy, the second layer having a first width;
 a composite anode electrode including
  a first anode electrode formed on a surface of the III-V nitride semiconductor layer and in Schottky contact with the III-V nitride semiconductor layer with a first Schottky barrier, the first anode electrode having a second width narrower than the first width, and
  a second anode electrode wider than the first anode electrode, covering the first anode electrode and in electrical contact with the first anode electrode, both sides of the second anode electrode being formed on the surface of the III-V nitride semiconductor layer and in Schottky contact with the III-V nitride semiconductor layer with a second Schottky barrier, the second Schottky barrier being higher than the first Schottky barrier;
 a contact layer formed on a side of the III-V nitride semiconductor layer;
 a cathode electrode formed on a surface of the contact layer and in ohmic contact with the contact layer; and
 an insulating protection film formed on the surface of the III-V nitride semiconductor layer between the second anode electrode and the cathode electrode, wherein the insulating protection film has a first end portion sandwiched, in a thickness direction of the device, between the second anode electrode and the III-V nitride semiconductor layer and a second end portion sandwiched, in the thickness direction of the device, between the cathode electrode and the contact layer.

2. The GaN semiconductor device according to claim 1, wherein the composite anode electrode is free of direct contact with the first layer.

3. The GaN semiconductor device according to claim 1, wherein the contact layer is in direct contact with both the first and second layers.

4. The GaN semiconductor device according to claim 1, wherein the surface of the contact layer is flush with a surface of the second layer.

5. The GaN semiconductor device according to claim 1, wherein a width of each of the sides of the second anode electrode formed on the surface of the III-V nitride semiconductor layer is 2 micrometers to 10 micrometers.

6. The GaN semiconductor device according to claim 1, wherein a thickness of each of the first anode electrode and the second anode electrode is 0.02 micrometers to 0.5 micrometers.

7. The GaN semiconductor device according to claim 1, wherein
the first layer and the second layer form a hetero junction structure for generating a two-dimensional electron gas in the first layer near an interface between the first layer and the second layer, and
the contact layer has a thickness reaching an end portion of the two-dimensional electron gas.

8. The GaN semiconductor device according to claim 1, wherein a thickness of the III-V nitride semiconductor layer in a first portion where the composite anode electrode is formed is thinner than a thickness of the III-V nitride semiconductor layer in a second portion other than the first portion.

9. The GaN semiconductor device according to claim 8, wherein
the III-V nitride semiconductor layer further includes a third layer of third III-V nitride semiconductor having a third bandgap energy smaller than the second bandgap energy, and
the third layer is embedded in the second layer and in Schottky contact with the first anode electrode.

10. The GaN semiconductor device according to claim 8, wherein
the III-V nitride semiconductor layer further includes an intermediate layer of a third III-V nitride semiconductor between the first layer and the second layer, and
the intermediate layer has a third bandgap energy larger than the second bandgap energy.

11. The GaN semiconductor device according to claim 10, wherein a thickness of the intermediate layer is 5 nanometers or less.

12. The GaN semiconductor device according to claim 1, wherein
the III-V nitride semiconductor layer further includes a third layer of third III-V nitride semiconductor having a third bandgap energy smaller than the second bandgap energy, and
the third layer is embedded in the second layer and in Schottky contact with the first anode electrode.

13. The GaN semiconductor device according to claim 1, wherein
the III-V nitride semiconductor layer further includes an intermediate layer of third III-V nitride semiconductor between the first layer and the second layer, and
the intermediate layer has a third bandgap energy larger than the second bandgap energy.

14. The GaN semiconductor device according to claim 13, wherein a thickness of the intermediate layer is 5 nanometers or less.

15. The GaN semiconductor device according to claim 1, wherein
the second III-V nitride semiconductor has a composition represented by $Al_xIn_yGa_{1-x-y}N_{1-l-k}As_lP_k$ ($0 \leq x \leq 1$, $0 \leq y \leq 1$, $0 \leq l \leq 1$, $0 \leq k \leq 1$), and
the first III-V nitride semiconductor has a composition represented by $In_yGa_{1-y}N$ ($0 \leq y \leq 1$).

16. The GaN semiconductor device according to claim 15, wherein the second layer is doped with an n-type impurity with a concentration of $5 \times 10^{17}$ cm$^{-3}$ or more.

17. The GaN semiconductor device according to claim 15, wherein a thickness of the second layer is 10 nanometers or less.

18. The GaN semiconductor device according to claim 15, wherein the first layer is doped with a p-type impurity including at least one of magnesium, zinc, and carbon.

* * * * *